US012721041B2

(12) United States Patent
Tanaka

(10) Patent No.: US 12,721,041 B2
(45) Date of Patent: Aug. 25, 2026

(54) PIEZOELECTRIC ACTUATOR

(71) Applicant: KYOCERA Corporation, Kyoto (JP)

(72) Inventor: Kazuki Tanaka, Kirishima (JP)

(73) Assignee: Kyocera Corporation, Kyoto (JP)

( * ) Notice: Subject to any disclaimer, the term of this patent is extended or adjusted under 35 U.S.C. 154(b) by 819 days.

(21) Appl. No.: 18/029,281

(22) PCT Filed: Aug. 18, 2021

(86) PCT No.: PCT/JP2021/030169
§ 371 (c)(1),
(2) Date: Mar. 29, 2023

(87) PCT Pub. No.: WO2022/070652
PCT Pub. Date: Apr. 7, 2022

(65) Prior Publication Data

US 2023/0371390 A1 Nov. 16, 2023

(30) Foreign Application Priority Data

Sep. 30, 2020 (JP) ................................ 2020-164695

(51) Int. Cl.
*H10N 30/50* (2023.01)
*H10N 30/20* (2023.01)
*H10N 30/87* (2023.01)

(52) U.S. Cl.
CPC ......... *H10N 30/508* (2023.02); *H10N 30/206* (2023.02); *H10N 30/871* (2023.02); *H10N 30/872* (2023.02); *H10N 30/875* (2023.02)

(58) Field of Classification Search
CPC .. H10N 30/508; H10N 30/206; H10N 30/871; H10N 30/872; H10N 30/875; H10N 30/88; H10N 30/50
See application file for complete search history.

(56) References Cited

U.S. PATENT DOCUMENTS 10,381,543 B2 8/2019 Galler et al.
10,439,126 B2 * 10/2019 Ozawa ................ H10N 30/875
2006/0091766 A1 5/2006 Mochizuki et al.

FOREIGN PATENT DOCUMENTS

JP 2013-211419 A 10/2013
WO 2013/114768 A1 8/2013
WO 2013/115341 A1 8/2013

* cited by examiner

*Primary Examiner* — Emily P Pham
(74) *Attorney, Agent, or Firm* — Volpe Koenig

(57) ABSTRACT

A piezoelectric actuator includes a piezoelectric element layered in a pillar shape, and electrode plates located on side surfaces of the piezoelectric element and electrically connected to internal electrode layers of the piezoelectric element. Each of the electrode plates includes a body portion extending in a layering direction of the piezoelectric element and a lead portion that extends in a direction intersecting the layering direction and is electrically connected to a lead terminal. The lead portion includes, in at least one side portion, a recessed portion recessed in a width direction of the lead portion.

9 Claims, 14 Drawing Sheets

PIEZOELECTRIC ACTUATOR

CROSS-REFERENCE TO RELATED APPLICATIONS

This application is national stage application of International Application No. PCT/JP2021/030169, filed on Aug. 18, 2021, which designates the United States, incorporated herein by reference, and which claims the benefit of priority from Japanese Patent Application No. 2020-164695, filed on Sep. 30, 2020, the entire contents of which are incorporated herein by reference.

TECHNICAL FIELD

The present disclosure relates to a piezoelectric actuator.

BACKGROUND OF INVENTION

In the related art, a known piezoelectric actuator includes a piezoelectric element and a metal case. The piezoelectric element is layered in a pillar shape. The metal case accommodates the piezoelectric element so that both end portions of the piezoelectric element are in contact with an inner wall of the metal case (for example, see Patent Document 1).

For example, in the piezoelectric actuator, an electrode plate is bonded to a side surface of a piezoelectric element having a columnar shape. A drive voltage is applied to the piezoelectric element via the electrode plate. The electrode plate includes a body portion bonded to the side surface of the piezoelectric element and a lead portion electrically connecting the body portion and a lead terminal.

CITATION LIST

Patent Literature

Patent Document 1: JP 2013-211419 A

SUMMARY

An aspect of the embodiment provides a piezoelectric actuator capable of suppressing peeling of an electrode plate from a piezoelectric element.

Solution to Problem

In an aspect of the embodiment, a piezoelectric actuator includes a piezoelectric element layered in a pillar shape, and an electrode plate located on a side surface of the piezoelectric element and being electrically connected to an internal electrode layer of the piezoelectric element. The electrode plate includes a body portion extending in a layering direction of the piezoelectric element, and a lead portion extending in a direction intersecting the layering direction and being electrically connected to a lead terminal. The lead portion includes, in at least one side portion thereof, a recessed portion recessed in a width direction of the lead portion.

DESCRIPTION OF EMBODIMENTS

An embodiment of a piezoelectric actuator disclosed in the present application will be described below with reference to the accompanying drawings. The present disclosure is not limited by the following embodiment. Note that the drawings are schematic and that the dimensional relationships between elements, the proportions thereof, and the like may differ from the actual ones. There may be differences between the drawings in the dimensional relationships, proportions, and the like.

In the related art, a known piezoelectric actuator includes a piezoelectric element and a metal case. The piezoelectric element is layered in a pillar shape. The metal case accommodates the piezoelectric element so that both end portions of the piezoelectric element are in contact with an inner wall of the metal case.

For example, in the piezoelectric actuator, an electrode plate is bonded to a side surface of a piezoelectric element having a columnar shape. A drive voltage is applied to the piezoelectric element via the electrode plate. The electrode plate includes a body portion bonded to the side surface of the piezoelectric element and a lead portion electrically connecting the body portion and a lead terminal.

However, in the related art, the lead portion may be unable to sufficiently deform with respect to an expansion and contraction operation of the piezoelectric element, and the body portion may peel from the piezoelectric element.

Accordingly, the above-described problems are expected to be overcome by realizing a technique by which peeling of an electrode plate from a piezoelectric element can be suppressed.

Overall Configuration of Piezoelectric Actuator

Figure 1:
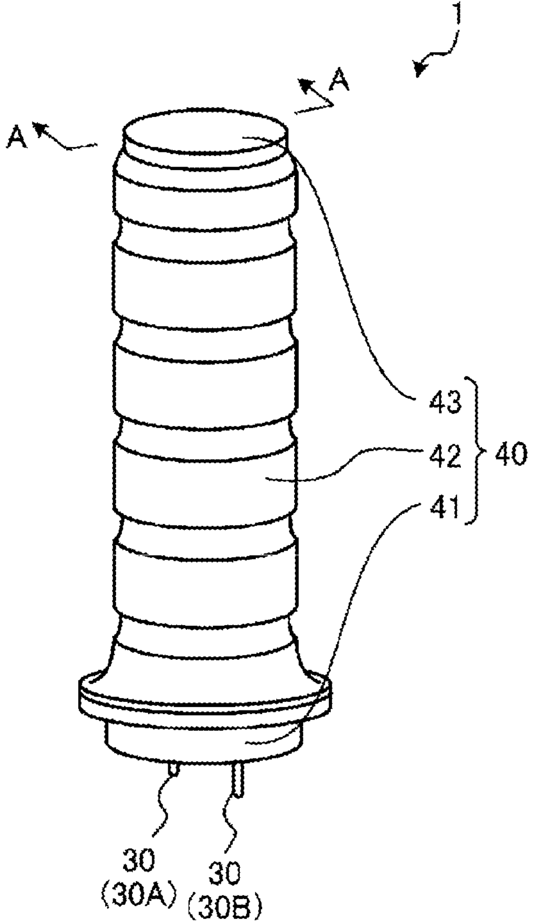
FIG. 1 is a perspective view illustrating an overall configuration of a piezoelectric actuator according to an embodiment.
Figure 2:
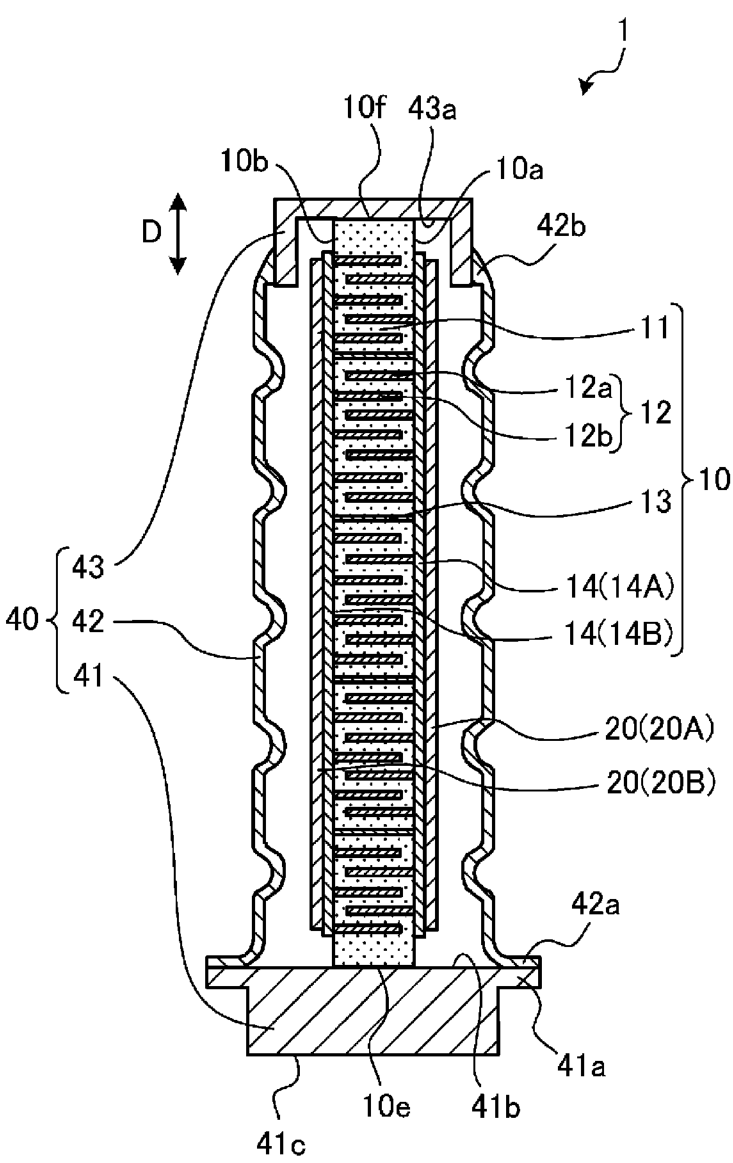
FIG. 2 is an arrow cross-sectional view taken along an A-A line illustrated in FIG. 1.
Figure 3:
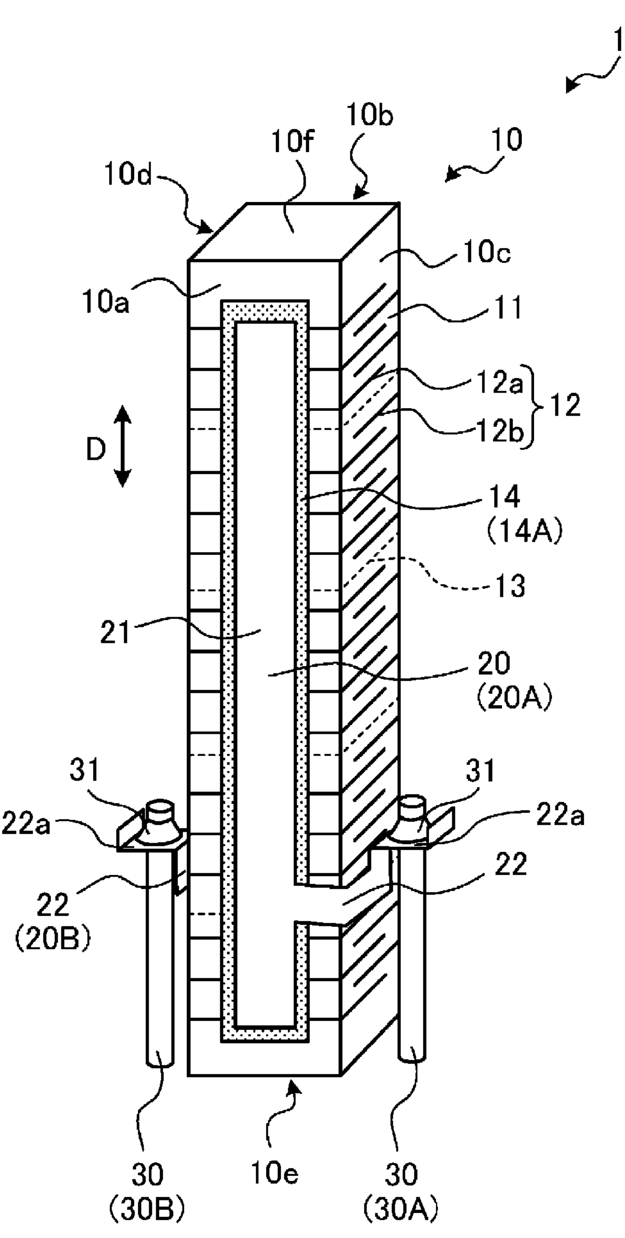
FIG. 3 is a perspective view illustrating a configuration of an inner portion of the piezoelectric actuator according to the embodiment.

First, an overall configuration of a piezoelectric actuator 1 according to an embodiment will be described with reference to FIGS. 1 to 3. FIG. 1 is a perspective view illustrating the overall configuration of the piezoelectric actuator 1 according to the embodiment, and FIG. 2 is an arrow cross-sectional view taken along an A-A line illustrated in FIG. 1. FIG. 3 is a perspective view illustrating a configuration of an inner portion of the piezoelectric actuator 1 according to the embodiment.

As illustrated in FIGS. 1 to 3, the piezoelectric actuator 1 according to the embodiment includes a piezoelectric element 10, a pair of electrode plates 20, a pair of lead terminals 30, and a case 40. The pair of electrode plates 20 includes an electrode plate 20A and an electrode plate 20B. The pair of lead terminals 30 includes a lead terminal 30A and a lead terminal 30B.

As illustrated in FIG. 3, the piezoelectric element 10 has a pillar shape. For example, the piezoelectric element 10 has a quadrangular pillar shape (rectangular parallelepiped shape) having a length of from 0.5 (mm) to 10 (mm), a width of from 0.5 (mm) to 10 (mm), and a height of from 1 (mm) to 100 (mm). The shape of the piezoelectric element 10 is not limited to the quadrangular pillar shape, and may be a hexagonal pillar shape, an octagonal pillar shape, a cylindrical shape, or the like.

As illustrated in FIG. 2, the piezoelectric element 10 includes a piezoelectric-body layer 11, an internal electrode layer 12, a predetermined breaking layer 13, and a pair of side surface electrodes 14. The pair of side surface electrodes 14 include a side surface electrode 14A and a side surface electrode 14B.

In the piezoelectric element 10, the piezoelectric-body layer 11, the internal electrode layer 12, and the predetermined breaking layer 13 are layered in a predetermined order along a layering direction D. In the present disclosure, the layering direction D of the piezoelectric element 10 coincides with a longitudinal direction of the piezoelectric element 10.

The piezoelectric-body layer 11 is formed of a piezoelectric material having piezoelectric characteristics, such as a piezoelectric ceramic. Examples of materials of the piezoelectric ceramic include perovskite-type oxides containing lead zirconate titanate ($PbZrO_3$—$PbTiO_3$), lithium niobate ($LiNbO_3$), or lithium tantalate ($LiTaO_3$).

The average particle diameter of the piezoelectric ceramic is from 1.6 (μm) to 2.8 (μm), for example. The thickness of the piezoelectric-body layer 11 is from 3 (μm) to 250 (μm), for example.

The internal electrode layer 12 is formed of an electrically conductive material and includes a plurality of first electrode layers 12*a* and a plurality of second electrode layers 12*b*. The first electrode layers 12*a* are electrically connected to the side surface electrode 14A. The side surface electrode 14A is disposed on one side surface 10*a* among side surfaces of the piezoelectric element 10. A predetermined positive voltage is applied to the first electrode layers 12*a* via the side surface electrode 14A.

The second electrode layers 12*b* are electrically connected to the side surface electrode 14B. The side surface electrode 14B is disposed on a side surface 10*b* opposite to the side surface 10*a* of the piezoelectric element 10. A predetermined negative voltage (or a ground voltage) is applied to the second electrode layers 12*b* via the side surface electrode 14B.

As illustrated in FIG. 2, in an inner portion of the piezoelectric element 10, the first electrode layer 12*a*, the second electrode layer 12*b*, and the piezoelectric-body layer 11 are layered so that the piezoelectric-body layer 11 is disposed between the first electrode layer 12*a* and the second electrode layer 12*b*. Thus, in the piezoelectric element 10, a drive voltage can be applied to the piezoelectric-body layer 11 by the first electrode layer 12*a* and the second electrode layer 12*b*.

The piezoelectric element 10 according to the embodiment includes an active section and inactive sections. The active section is formed by alternately layering a plurality of the piezoelectric-body layers 11 and a plurality of the internal electrode layers 12. The inactive sections are disposed on both end sides of the active section in the layering direction D and each includes the piezoelectric-body layer 11.

The active section is a site that expands or contracts (hereinafter also referred to as expansion and contraction) in the layering direction D upon application of a drive voltage to the piezoelectric element 10 from the outside. On the other hand, the inactive section is a site that does not expand or contract, even upon application of a drive voltage to the piezoelectric element 10 from the outside.

In the present disclosure, an end portion of the case 40 on a side of a base 41 is referred to as a base end portion 10*e* of the piezoelectric element 10, and an end portion of the case 40 on a side of a lid 43 is referred to as a distal end portion 10*f* of the piezoelectric element 10.

In the piezoelectric actuator 1 according to the embodiment, the base end portion 10*e* (that is, the base 41) of the piezoelectric element 10 is fixed, and the distal end portion 10*f* (that is, the lid 43) of the piezoelectric element 10 is displaced along the layering direction D.

The material constituting the internal electrode layer 12 is, for example, a metal containing silver, silver-palladium, silver-platinum, copper, or the like as a main component. For example, the internal electrode layer 12 can be formed by firing the material of the internal electrode layer 12 at the same time as the piezoelectric-body layer 11. The thickness of the internal electrode layer 12 is from 0.1 (μm) to 5 (μm), for example.

The predetermined breaking layer 13 relaxes stress generated by driving of the piezoelectric element 10. Examples of the predetermined breaking layer 13 include a porous metal layer that does not function as the internal electrode layer 12, and a metal layer that is provided with a crack in advance. Note that, in the piezoelectric element 10 according to the embodiment, the predetermined breaking layer 13 may be omitted.

As described above, the pair of side surface electrodes 14 include the side surface electrode 14A located on the side surface 10*a* of the piezoelectric element 10 and the side surface electrode 14B located on the side surface 10*b* of the piezoelectric element 10. The side surface electrodes 14 are disposed over the entire active section of the piezoelectric element 10.

For example, a material of the side surface electrodes 14 is a metal containing silver, copper, or the like as a main component. For example, a metallization layer made of a sintered body of the above-described metal and glass can be used as the side surface electrodes 14. The thickness of the side surface electrodes 14 is from 5 (μm) to 500 (μm), for example.

Although not illustrated in the present disclosure, a coating layer made of an insulator may be disposed on a side surface 10*c* (see FIG. 3) and a side surface 10*d* (see FIG. 3) located between the side surface 10*a* and the side surface 10*b* of the piezoelectric element 10. By providing the coating layer on the side surfaces 10*c* and 10*d*, the occurrence of a creeping discharge between the electrodes can be suppressed when a high voltage is applied during driving.

Examples of the insulator serving as the coating layer include a ceramic material. Examples of the ceramic material include a material that can be deformed by stress so as to follow the expansion and contraction of the piezoelectric element 10 when the piezoelectric actuator 1 is driven, and to eliminate the possibility of a creeping discharge occurring as a result of the coating layer peeling off.

Specific examples of the coating layer include ceramic materials such as partially stabilized zirconia and $Ln_{1-x}Si_xAlO_{3+0.5X}$, which are deformable by local phase transformation and volume change when stress occurs. Note that Ln represents at least one selected from the group consisting of Sn, Y, La, Ce, Pr, Nd, Pm, Sm, Eu, Gd, Tb, Dy, Ho, Er, Tm, and Yb, and x=0.01 to 0.3.

Alternatively, the material of the coating layer may be a piezoelectric material such as barium titanate and lead zirconate titanate in which the distance between ions in the crystal lattice changes so as to relax the generated stress.

The pair of electrode plates 20 include the electrode plate 20A and the electrode plate 20B, and electrically connect the pair of side surface electrodes 14 to the pair of lead terminals 30, respectively. Specifically, the electrode plate 20A electrically connects the side surface electrode 14A to the lead terminal 30A, and the electrode plate 20B electrically connects the side surface electrode 14B to the lead terminal 30B.

As illustrated in FIG. 3, each of the electrode plates 20 is substantially T-shaped and includes a body portion 21 and a lead portion 22. The body portion 21 is a site extending in the layering direction D of the piezoelectric element 10 and is electrically and mechanically connected to the side surface electrodes 14 of the piezoelectric element 10.

The body portion 21 has substantially the same size and/or a similar size to the side surface electrodes 14, and is bonded to the side surface electrodes 14 by an electrically conductive bonding material. As the electrically conductive bonding material, for example, an epoxy resin, a polyimide resin, or the like containing a metal powder having high electric conductivity such as Ag powder and Cu powder may be used.

In the present disclosure, an example in which the electrode plates 20 and the internal electrode layers 12 are electrically connected via the side surface electrodes 14 has been described. However, the side surface electrodes 14 may be omitted, as long as conduction between the electrode plates 20 and the internal electrode layers 12 is sufficiently achieved. In this case, the electrode plates 20 and the internal electrode layers 12 are directly connected to each other.

On the other hand, by providing the side surface electrodes 14, the electrode plates 20 and the internal electrode layers 12 can be stably electrically connected to each other. Thus, according to the embodiment, the piezoelectric actuator 1 can have improved reliability.

The lead portion 22 is a site extending in a direction intersecting the layering direction D and is electrically and mechanically connected to the lead terminals 30. The lead portion 22 is drawn and turned while being bent from one side surface of the piezoelectric element 10 to which the body portion 21 is bonded toward an adjacent side surface.

For example, as illustrated in FIG. 3, in the electrode plate 20A bonded to the side surface 10*a* of the piezoelectric element 10, the lead portion 22 is drawn and turned while being bent from the side surface 10*a* toward the side surface 10*c* adjacent to the side surface 10*a*.

Although not completely illustrated in FIG. 3, in the electrode plate 20B bonded to the side surface 10*b* of the piezoelectric element 10, in the same or in a similar manner to the electrode plate 20A, the lead portion 22 is drawn and turned while being bent from the side surface 10*b* toward the side surface 10*d* adjacent to the side surface 10*b*.

For example, the material constituting the electrode plates 20 is a metal such as copper, iron, stainless steel, or phosphor bronze. The width of the electrode plates 20 is, for example, from 0.5 (mm) to 10 (mm), and the thickness of the electrode plates 20 is, for example, from 0.01 (mm) to 1.0 (mm). A plating film M (see FIG. 10) such as tin plating or silver plating may be applied to a surface of the electrode plates 20 in order to improve electric conductivity and/or thermal conductivity.

As illustrated in FIG. 3, the pair of lead terminals 30 includes the lead terminal 30A and the lead terminal 30B, and the lead terminals 30 are disposed to face the side surfaces 10*c* and 10*d* of the piezoelectric element 10, respectively. Specifically, the lead terminal 30A is disposed to face the side surface 10*c* of the piezoelectric element 10, and the lead terminal 30B is disposed to face the side surface 10*d* of the piezoelectric element 10.

A hole portion 22*a*1 (see FIG. 11) is disposed in a distal end portion 22*a* of each of the electrode plates 20 which are drawn and turned from one side surface toward an adjacent side surface of the piezoelectric element 10. The lead terminals 30 are inserted into the hole portions 22*a*1 of the distal end portions 22*a* and are bonded by a bonding material 31 that is electrically conductive. Thus, the electrode plates 20 and the lead terminals 30 are electrically and mechanically connected to each other.

In the embodiment, the lead portion 22 of each of the electrode plates 20 includes a plurality of bent portions 22*e* (see FIG. 11), and therefore, vibration transmitted via the electrode plate 20 can be suppressed. In the embodiment, the lead portion 22 is drawn and turned over a long distance from one side surface toward an adjacent side surface of the piezoelectric element 10, and therefore, the vibration transmitted via the electrode plate 20 can be further reduced.

As illustrated in FIG. 2, the case 40 accommodates the piezoelectric element 10 and the electrode plates 20 in an inner portion of the case 40. The case 40 includes the base 41, a tubular body 42, and the lid 43. The base 41 has a pillar shape (for example, a cylindrical shape) and includes a widened portion 41*a* having an expanded width at an end portion on one side (an upper side in FIG. 2) of the base 41.

An end surface 41*b* on the widened portion 41*a* side is in contact with the base end portion 10*e* of the piezoelectric element 10. The end surface 41*b* of the base 41 and the base end portion 10*e* of the piezoelectric element 10 may be bonded to each other with a bonding material (not illustrated).

In the base 41, a pair of through holes (not illustrated) penetrating between the end surface 41*b* and an end surface 41*c* on an opposite side of the end surface 41*b* is provided, and each lead terminal of the pair of lead terminals 30 is inserted into a respective one of the pair of through holes.

A gap between the through holes of the base 41 and the lead terminals 30 is filled with an insulation material (for example, soft glass) to fix the lead terminals 30 to the base 41. The lead terminals 30 are inserted into the base 41 from the inside of the case 40 and protrude outward from the end surface 41*c* of the base 41 (see FIG. 1).

The tubular body 42 has a tubular shape (for example, a cylindrical shape). The tubular body 42 has a bellows shape, and the axial direction of the tube of the tubular body 42 coincides with the layering direction D of the piezoelectric element 10. Thus, the tubular body 42 can expand and contract in the axial direction by following the expansion and contraction of the piezoelectric element 10 in the layering direction D.

The tubular body 42 has a predetermined spring coefficient so as to be able to follow the expansion and contraction of the piezoelectric element 10. The spring coefficient of the tubular body 42 can be adjusted by the thickness of the tubular body 42, the groove shape of the tubular body 42, the number of grooves of the tubular body 42, and the like. The thickness of the tubular body 42 is, for example, from 0.1 (mm) to 0.5 (mm), and a diameter of the tubular body 42 is, for example, from 5 (mm) to 50 (mm).

The tubular body 42 includes, at an end portion on a side of the base 41, a flange portion 42*a* widened in a trumpet shape toward the outer side in a radial direction. The flange portion 42*a* of the tubular body 42 and the widened portion 41*a* of the base 41 are welded to each other, for example, with a compressive load applied to the piezoelectric element 10.

The tubular body 42 is formed, for example, by preparing a seamless tube having a predetermined shape and then, processing the seamless tube into a bellows shape by rolling processing or hydrostatic pressing.

The lid 43 has a tubular shape (for example, a cylindrical shape) of which one end is sealed. An outer diameter of the lid 43 is slightly smaller than an inner diameter of an end portion 42*b* of the tubular body 42 on the opposite side of the flange portion 42*a*. The lid 43 is fitted into the end portion 42*b*, and an inner wall of the end portion 42*b* and a side wall of the lid 43 are fixed to each other by welding, for example.

An inner bottom surface 43*a* of the lid 43 is in contact with the distal end portion 10*f* of the piezoelectric element 10. The inner bottom surface 43*a* of the lid 43 and the distal end portion 10*f* of the piezoelectric element 10 may be bonded to each other with a bonding material (not illustrated).

Configuration of Electrode Plate

Figure 4:
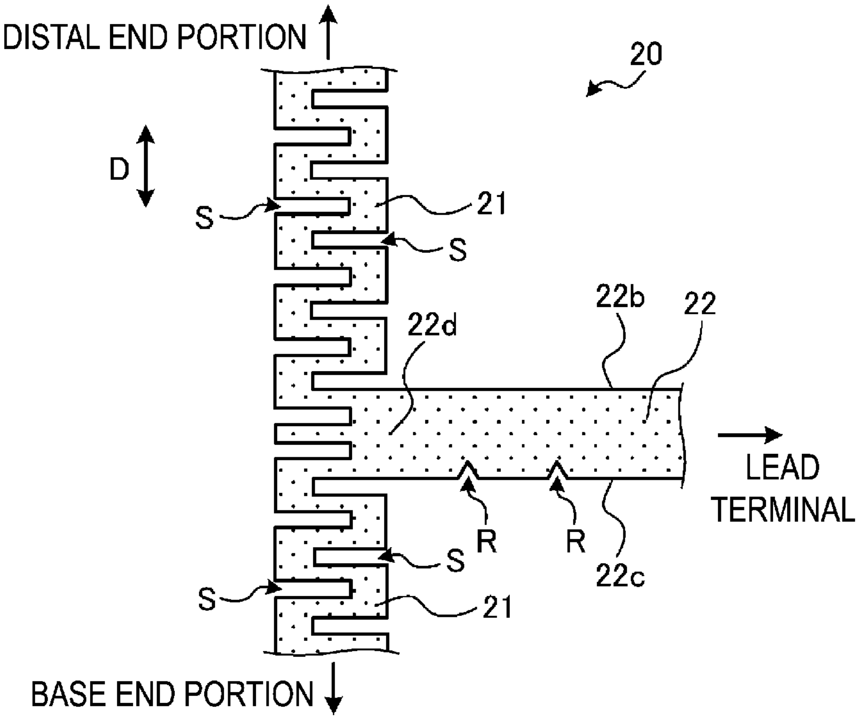
FIG. 4 is an enlarged plan view illustrating a configuration of an electrode plate according to the embodiment.

A configuration of the electrode plate 20 according to the embodiment will be described in detail with reference to FIGS. 4 to 11. FIG. 4 is an enlarged plan view illustrating the configuration of the electrode plate 20 according to the embodiment. As described above, the electrode plate 20 is substantially T-shaped and includes the body portion 21 extending in the layering direction D of the piezoelectric element 10 and the lead portion 22 extending in a direction intersecting the layering direction D.

As illustrated in FIG. 4, in the embodiment, the body portion 21 of the electrode plate 20 includes a plurality of slits S. For example, the slits S are notched so as to extend along a width direction of the body portion 21 (that is, a direction perpendicular to the layering direction D).

The plurality of slits S are alternately notched from both side portions of the body portion 21, and are disposed side by side at substantially equal intervals along the layering direction D. All of the plurality of slits S have substantially the same length. Note that the length of the slits S refers to a length in a notched direction of the slits S (that is, the width direction of the body portion 21).

The length of the plurality of slits S is set so that distal ends of the plurality of slits S overlap each other when viewed in the layering direction D. Here, the term “overlap” means that adjacent ones of the slits S include regions facing each other when viewed in the layering direction D.

In the embodiment, by disposing the plurality of slits S in the body portion 21 of the electrode plate 20, the body portion 21 can be caused to expand and contract in the layering direction D by following the expansion and contraction of the piezoelectric element 10 in the layering direction D. Thus, according to the embodiment, peeling of the electrode plate 20 from the piezoelectric element 10 can be suppressed.

The lead portion 22 of the electrode plate 20 includes a pair of side portions 22*b* and 22*c*. The side portion 22*b* is a side portion on a side of the distal end portion 10*f* (see FIG. 3) of the piezoelectric element 10 (see FIG. 3), and the side portion 22*c* is a side portion on a side of the base end portion 10*e* (see FIG. 3) of the piezoelectric element 10.

Here, in the embodiment, the lead portion 22 includes, on at least one side portion (the side portion 22*c* in FIG. 4), recessed portions R recessed in the width direction of the lead portion 22. The width direction of the lead portion 22 is a direction perpendicular to a direction in which the lead portion 22 extends.

Thus, following the expansion and contraction of the piezoelectric element 10 in the layering direction D, the lead portion 22 twists with the recessed portions R as a starting point, and the lead portion 22 can be easily deformed. According to the embodiment, stress generated in a base end portion 22*d* of the lead portion 22 due to the expansion and contraction of the piezoelectric element 10 can be relaxed, and thus, peeling of the electrode plate 20 from the piezoelectric element 10 can be suppressed.

In the embodiment, a plurality of the recessed portions R may be disposed in one side portion of the lead portion 22. Thus, the lead portion 22 can be more easily deformed by following the expansion and contraction of the piezoelectric element 10 in the layering direction D.

According to the embodiment, the stress generated in the base end portion 22*d* of the lead portion 22 due to the expansion and contraction of the piezoelectric element 10 can be further relaxed, and thus, peeling of the electrode plate 20 from the piezoelectric element 10 can be further suppressed.

Although two of the recessed portions R are disposed in one side portion in the example in FIG. 4, the number of the recessed portions R disposed in one side portion is not limited to two, and one recessed portion R may be disposed, or three or more of recessed portions R may be disposed. The plurality of recessed portions R provided in one side portion may all have substantially the same size, or may have different sizes.

In the embodiment, the recessed portion R may be disposed at least in the side portion 22*c* on the base end portion 10*e* side of the piezoelectric element 10, among the pair of side portions 22*b* and 22*c* of the lead portion 22. Thus, the side portion 22*c* on the base end portion 10*e* side to which a large tensile stress is applied when the piezoelectric element 10 is expanded can be easily deformed.

According to the embodiment, stress generated in the base end portion 22*d* of the lead portion 22 when the piezoelectric element 10 expands can be relaxed, and thus, peeling of the electrode plate 20 from the piezoelectric element 10 can be suppressed.

In the embodiment, the recessed portion R may be disposed at a position closer to the base end portion **22*d* of the lead portion 22 than the distal end portion 22*a* (see FIG. 3) of the lead portion 22. As described above, by arranging the recessed portion R at a position close to the base end portion 22*d* adjacent to the body portion 21 where peeling occurs, the lead portion 22 can be easily deformed with respect to the expansion and contraction of the piezoelectric element 10**.

According to the embodiment, the stress generated in the base end portion **22*d* of the lead portion 22 due to the expansion and contraction of the piezoelectric element 10 can be further relaxed, and thus, peeling of the electrode plate 20 from the piezoelectric element 10** can be further suppressed.

Figure 5:
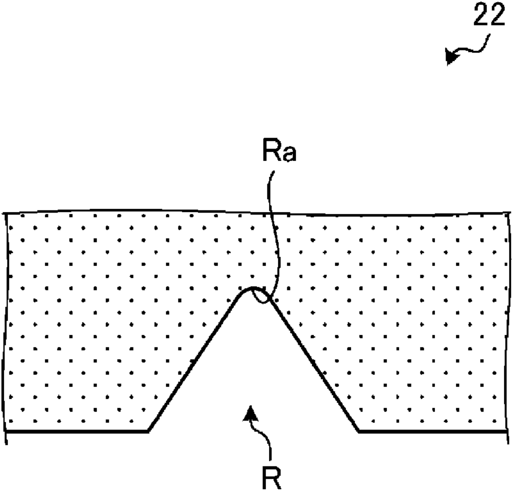
FIG. 5 is an enlarged plan view illustrating a shape of a recessed portion located at a lead portion according to the embodiment.

FIG. 5 is an enlarged plan view illustrating a shape of the recessed portion R located at the lead portion 22 according to the embodiment. As illustrated in FIG. 5, the recessed portion R according to the embodiment may be substantially V-shaped. Thus, the lead portion 22 can be more easily deformed by following the expansion and contraction of the piezoelectric element 10 in the layering direction D.

According to the embodiment, the stress generated in the base end portion **22*d* of the lead portion 22 due to the expansion and contraction of the piezoelectric element 10 can be further relaxed, and thus, peeling of the electrode plate 20 from the piezoelectric element 10** can be further suppressed.

In the embodiment, as illustrated in FIG. 5, a bottom portion Ra of the recessed portion R may have a round shape. Thus, when the lead portion 22 is deformed due to the expansion and contraction of the piezoelectric element 10, the concentration of stress on the bottom portion Ra of the recessed portion R can be suppressed, separation of the lead portion 22 from the bottom portion Ra can be suppressed, and the occurrence of cracks can be suppressed.

Thus, according to the embodiment, the piezoelectric actuator 1 can have improved reliability.

If the slits S extending over a long distance in the notch direction are disposed in the lead portion 22 instead of the recessed portion R having a small depth, the volume resistivity of the lead portion 22 increases, and thus, local heat generation may occur in the lead portion 22. That is, when the slits S extending over a long distance in the notch direction are disposed in the lead portion 22, the reliability of the piezoelectric actuator 1 may decrease.

On the other hand, in the embodiment, the recessed portion R having a small depth is disposed in the lead portion 22, so that local heat generation in the lead portion 22 can be suppressed, and therefore, excellent reliability of the piezoelectric actuator 1 can be maintained.

In the recessed portion R of the present disclosure, the ratio of depth to width may be 2 times or less, for example. Thus, local heat generation in the lead portion 22 can be suppressed, and therefore, excellent reliability of the piezoelectric actuator 1 can be maintained.

The depth of the recessed portion R may be one tenth or less of the width of the lead portion 22. Thus, the piezoelectric actuator 1 can be stably driven for a long period of time without hindering power supply from the lead terminal 30.

In the embodiment, the width of the recessed portion R may be, for example, in a range from 0.01 to 0.1 (mm), and the depth of the recessed portion R may be, for example, in a range from 0.05 to 1.0 (mm).

Figure 6:
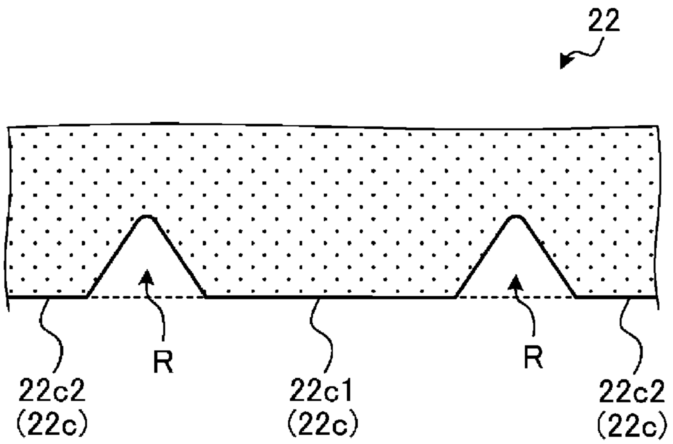
FIG. 6 is an enlarged plan view illustrating an example of a configuration of recessed portions and a vicinity thereof in the lead portion according to the embodiment.

FIG. 6 is an enlarged plan view illustrating an example of a configuration of the recessed portions R and a vicinity thereof in the lead portion 22 according to the embodiment. As illustrated in FIG. 6, the side portion **22*c* where the recessed portions R are located at the lead portion 22 includes a first region 22*c*1 sandwiched between the pair of recessed portions R and second regions 22*c*2 other than the first region 22*c*1**.

In the lead portion 22 according to the embodiment, as illustrated in FIG. 6, the first region **22*c*1 and the second regions 22*c*2 may be substantially flush with each other in the vicinity of the pair of recessed portions R in the side portion 22*c***.

Figure 7:
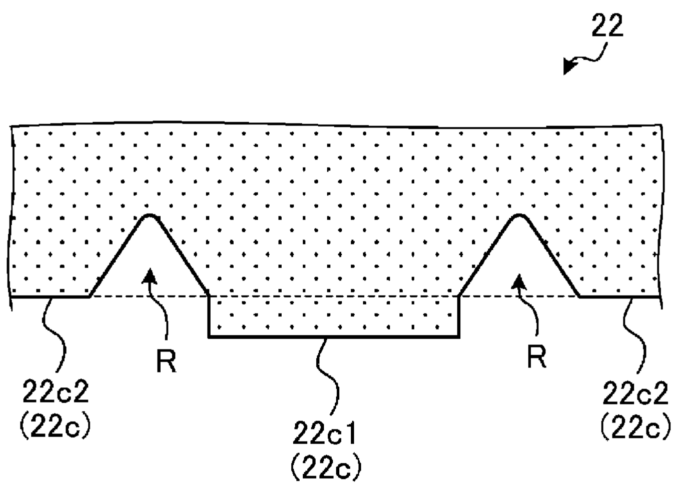
FIG. 7 is an enlarged plan view illustrating another example of a configuration of recessed portions and the vicinity thereof in the lead portion according to the embodiment.
Figure 8:
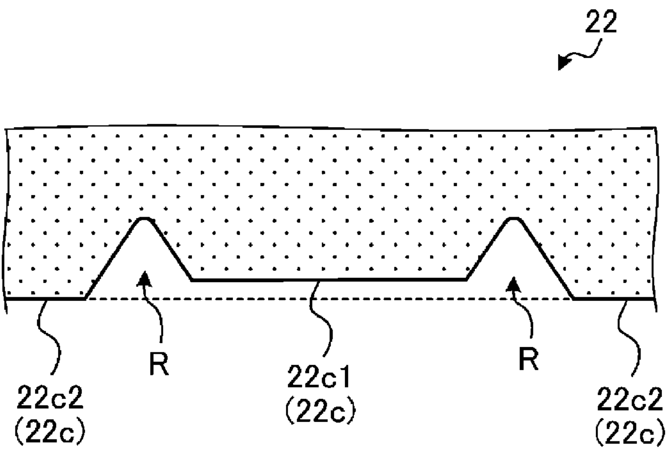
FIG. 8 is an enlarged plan view illustrating another example of a configuration of recessed portions and the vicinity thereof in the lead portion according to the embodiment.
Figure 9:
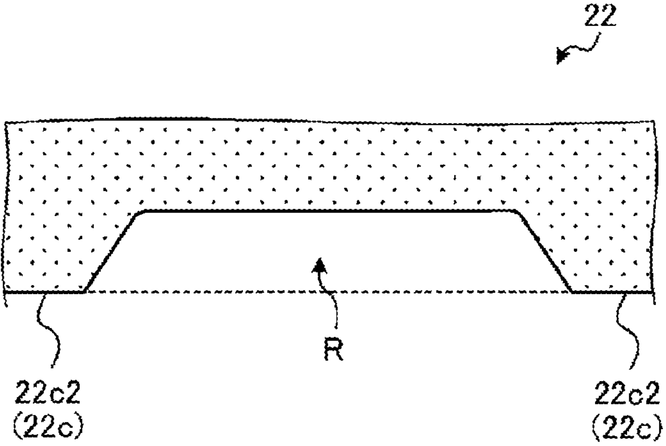
FIG. 9 is an enlarged plan view illustrating another example of a configuration of a recessed portion and the vicinity thereof in the lead portion according to the embodiment.

The lead portion 22 according to the embodiment is not limited to the case where the first region **22*c*1 and the second regions 22*c*2 are substantially flush with each other. FIGS. 7 to 9 are enlarged plan views illustrating other examples of the configuration of the recessed portions R and the vicinity thereof in the lead portion 22** according to the embodiment.

As illustrated in FIG. 7, in the lead portion 22 according to the embodiment, the first region **22*c*1 may protrude outward with respect to the second regions 22*c*2 in the vicinity of the pair of recessed portions R in the side portion 22*c***.

As illustrated in FIG. 8, in the lead portion 22 according to the embodiment, the first region **22*c*1 may be retracted inward with respect to the second regions 22*c*2 in the vicinity of the pair of recessed portions R in the side portion 22*c***.

In the lead portion 22 according to the embodiment, in the vicinity of the pair of recessed portions R in the side portion **22*c*, the first region 22*c*1 may be retracted to the bottom portion Ra of the recessed portion R, so that the pair of recessed portions R are formed as one recessed portion R having a substantially trapezoidal shape, as illustrated in FIG. 9**.

Figure 10:
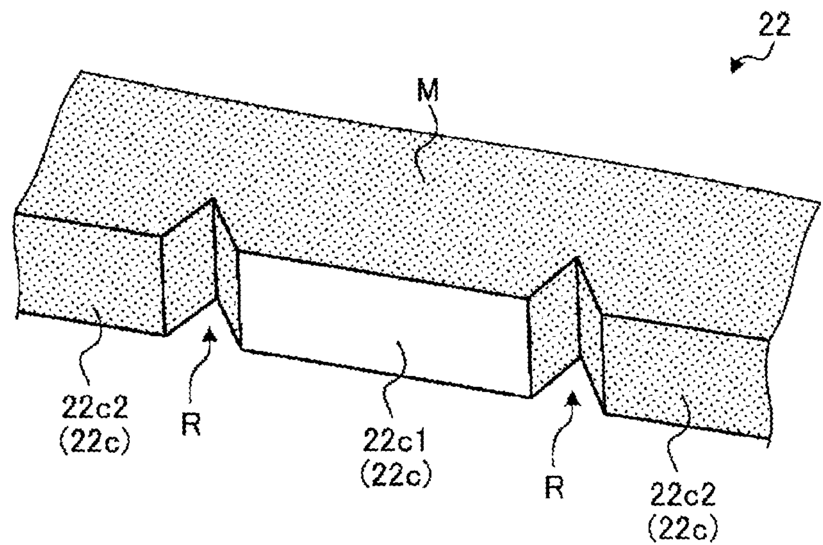
FIG. 10 is an enlarged perspective view illustrating another example of a configuration of recessed portions and a vicinity thereof in the lead portion according to the embodiment.

FIG. 10 is an enlarged perspective view illustrating another example of a configuration of the recessed portions R and a vicinity thereof in the lead portion 22 according to the embodiment. As described above, the plating film M for improving electric conductivity and/or thermal conductivity is disposed on the surface of the electrode plate 20 according to the embodiment, including the surface of the lead portion 22. In FIG. 10, sites where the plating film M is disposed are hatched with dots.

Here, in the embodiment, as illustrated in FIG. 10, the side portion **22*c* of the lead portion 22 may include a site where the plating film M is not formed in the first region 22*c*1 between adjacent ones of the recessed portions R. For example, as illustrated in FIG. 10, the first region 22*c*1** may be entirely a site where the plating film M is not formed.

As described above, by providing the site where the plating film M having high hardness is not formed on the surface of the first region **22*c*1, the lead portion 22 can be more easily deformed following the expansion and contraction of the piezoelectric element 10 in the layering direction D. Thus, according to the embodiment, peeling of the electrode plate 20 from the piezoelectric element 10** can be further suppressed.

Figure 11:
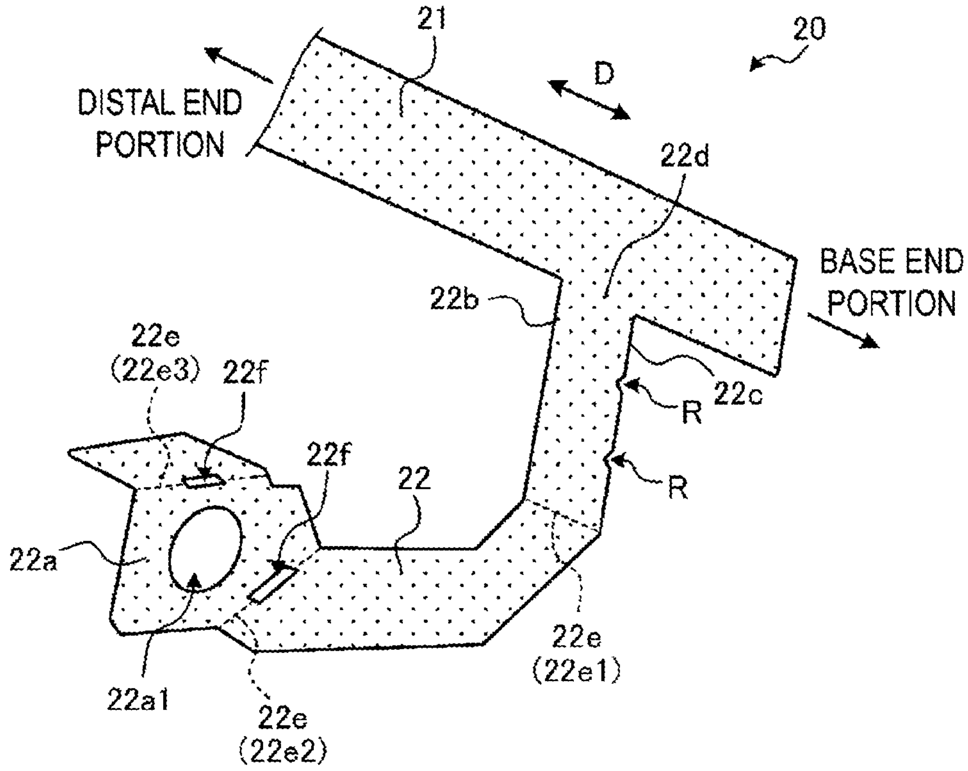
FIG. 11 is an enlarged perspective view illustrating a configuration of the electrode plate according to the embodiment.

FIG. 11 is an enlarged perspective view illustrating a configuration of the electrode plate 20 according to the embodiment. As illustrated in FIG. 11, in the lead portion 22, the plurality of bent portions **22*e* are disposed in a region from the base end portion 22*d* to the distal end portion 22*a***.

Among the plurality of bent portions **22*e*, a bent portion 22*e*1 closest to the base end portion 22*d* is disposed along a corner portion located between adjacent side surfaces in the piezoelectric element 10 (see FIG. 3**).

The bent portion **22*e*2 located next to the bent portion 22*e*1 with respect to the base end portion 22*d* is located around the hole portion 22*a*1 in the distal end portion 22*a* and is a bent portion for making the distal end portion 22*a*** substantially horizontal.

Furthermore, a bent portion **22*e*3 located next to the bent portion 22*e*2 with respect to the base end portion 22*d* is located around the hole portion 22*a*1 in the distal end portion 22*a*, and is located so as to face the bent portion 22*e*2 via the hole portion 22*a*1**.

In the embodiment, as illustrated in FIG. 11, the recessed portions R located in the side portion **22*c* of the lead portion 22 may be disposed between the base end portion 22*d* and the bent portion 22*e*1. As described above, the recessed portions R are disposed at positions close to the base end portion 22*d* adjacent to the body portion 21 where peeling occurs. Therefore, among the stresses generated in the lead portion 22 that changed in complex directions via the bent portion 22*e*1 following the expansion and contraction of the piezoelectric element 10 in the layering direction D, the stress on the base end portion 22*d* can be relaxed when the portion 22 twist with the recessed portion R as a starting point. Thus, peeling of the electrode plate 20 from the piezoelectric element 10** can be further suppressed.

According to the embodiment, the stress generated in the base end portion **22*d* of the lead portion 22 due to the expansion and contraction of the piezoelectric element 10 can be further relaxed, and thus, peeling of the electrode plate 20 from the piezoelectric element 10** can be further suppressed.

In the embodiment, the bent portions **22*e*2 and 22*e*3 located around the hole portion 22*a*1 may each include a through hole 22*f* Thus, when the lead terminal 30 (see FIG. 3) is inserted into the hole portion 22*a*1 and bonded with the bonding material 31 (see FIG. 3), stress around the lead terminal 30** can be relaxed.

Thus, according to the embodiment, the piezoelectric actuator 1 can have improved reliability. In the embodiment, the bonding material 31 may or may not enter the through hole **22*f***.

First Variation

Various variations of the embodiment will be described with reference to FIGS. 12 to 14. Note that, in the various variations below, portions that are the same as those in the embodiment will be denoted by the same reference signs, and redundant explanations may be omitted.

Figure 12:
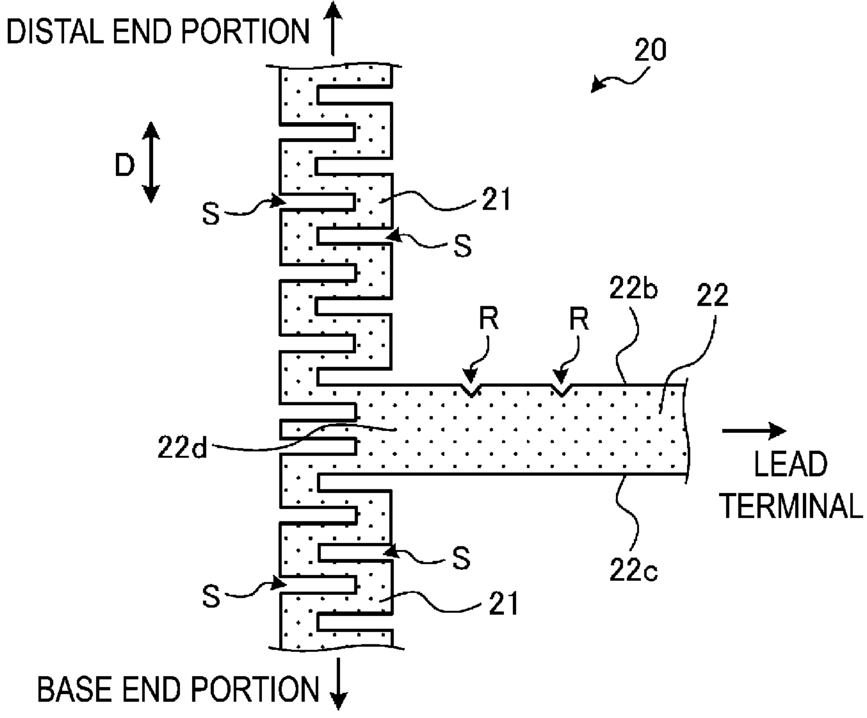
FIG. 12 is an enlarged plan view illustrating a configuration of an electrode plate according to a first variation of the embodiment.

FIG. 12 is an enlarged plan view illustrating a configuration of the electrode plate 20 according to a first variation of the embodiment. In the first variation illustrated in FIG. 12, the arrangement of the recessed portions R differs from the embodiment described above. Specifically, in the first variation, the recessed portions R are not disposed on the side portion **22*c* of the lead portion 22 on the base end portion 10*e* side (see FIG. 3) of the piezoelectric element 10 (see FIG. 3), but on the side portion 22*b* of the lead portion 22 on the distal end portion 10*f* side (see FIG. 3) of the piezoelectric element 10**.

Thus, the lead portion 22 can also be easily deformed by following the expansion and contraction of the piezoelectric element 10 in the layering direction D. Therefore, according to the first variation, peeling of the electrode plate 20 from the piezoelectric element 10 can be suppressed.

Second Variation

Figure 13:
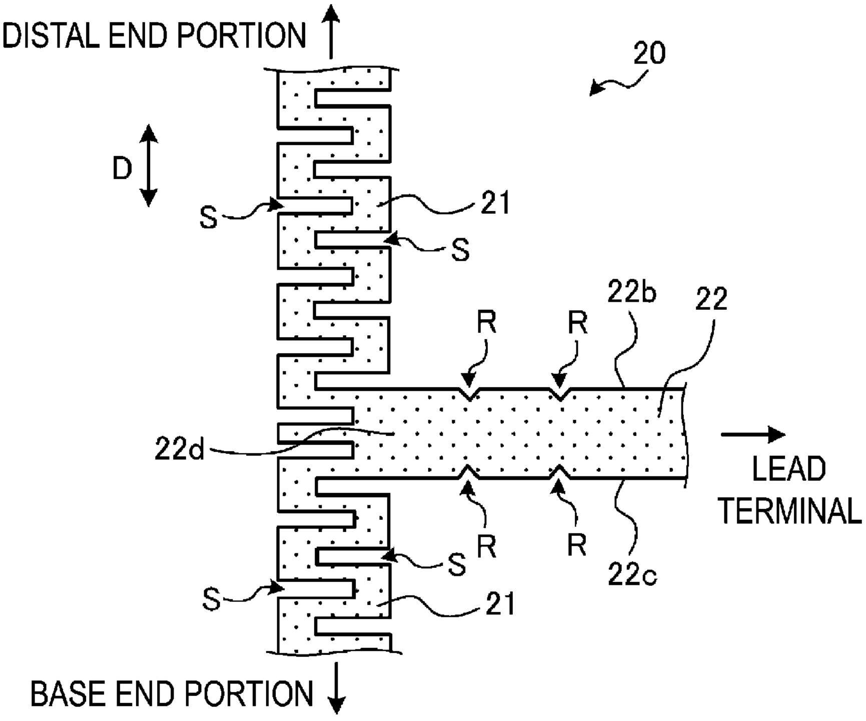
FIG. 13 is an enlarged plan view illustrating a configuration of an electrode plate according to a second variation of the embodiment.

FIG. 13 is an enlarged plan view illustrating a configuration of the electrode plate 20 according to a second variation of the embodiment. As illustrated in FIG. 13, in the second variation, the lead portion 22 includes a plurality of the recessed portions R in each of the side portions **22*b* and 22*c***.

Thus, in the second variation, following the expansion and contraction of the piezoelectric element 10 in the layering direction D, the lead portion 22 easily twists with the recessed portions R in both of the side surfaces as starting points, and the lead portion 22 can be more easily deformed. Therefore, according to the second variation, peeling of the electrode plate 20 from the piezoelectric element 10 can be further suppressed.

In the second variation, as illustrated in FIG. 13, the recessed portions R located in each of the side portions **22*b* and 22*c* of the lead portion 22 may be located facing each other. As described above, since the recessed portions R are located so as to face each other in each of the side portions 22*b* and 22*c*, the lead portion 22 is easily twisted in the region connecting the recessed portions R facing each other as a starting point. Thus, the lead portion 22** can be easily deformed in the vicinity of the recessed portions R even with a weak force.

Therefore, according to the second variation, peeling of the electrode plate 20 from the piezoelectric element 10 can be further suppressed. The recessed portions R facing each other in each of the side portions **22*b* and 22*c*** may have substantially the same size or may have different sizes.

Third Variation

Figure 14:
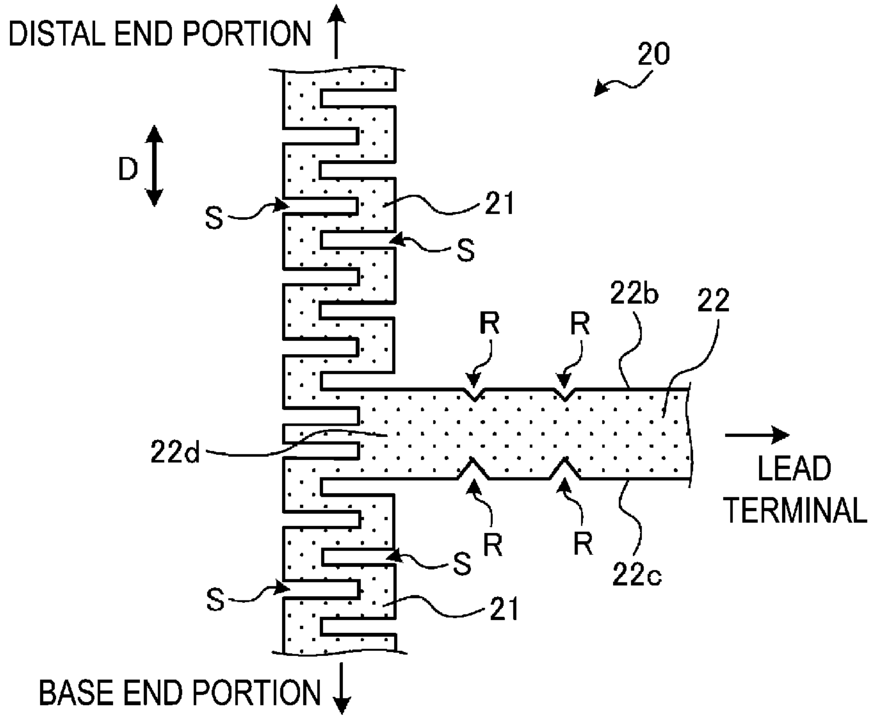
FIG. 14 is an enlarged plan view illustrating a configuration of an electrode plate according to a third variation of the embodiment.

FIG. 14 is an enlarged plan view illustrating a configuration of the electrode plate 20 according to a third variation of the embodiment. As illustrated in FIG. 14, in the third variation, in the same or in a similar manner to the second variation described above, the lead portion 22 includes a plurality of the recessed portions R in each of the side portions **22*b* and 22*c***.

On the other hand, in the third variation, the recessed portions R located in the side portion **22*c* of the piezoelectric element 10 on the base end portion 10*e* side (see FIG. 3) are deeper than the recessed portions R located in the side portion 22*b* of the piezoelectric element 10 (see FIG. 3) on the distal end portion 10*f* side (see FIG. 3). Thus, the side portion 22*c* on the base end portion 10*e* side to which a large tensile stress is applied when the piezoelectric element 10** is expanded can be more easily deformed.

According to the third variation, stress generated in the base end portion **22*d* of the lead portion 22 when the piezoelectric element 10 expands can be further relaxed, and thus, peeling of the electrode plate 20 from the piezoelectric element 10** can be further suppressed.

The piezoelectric actuator 1 according to the embodiment includes the piezoelectric element 10 layered in a pillar shape, and the electrode plates 20 located at the side surfaces **10*a* and 10*c* of the piezoelectric element 10 and being electrically connected to the internal electrode layers 12 of the piezoelectric element 10. Each of the electrode plates 20 includes the body portion 21 extending in the layering direction D of the piezoelectric element 10 and the lead portion 22 extending in a direction intersecting the layering direction D and being electrically connected to the lead terminal 30. The lead portion 22 includes the recessed portion R recessed in the width direction of the lead portion 22 in at least one of the side portions 22*c* (22*b*). Thus, peeling of the electrode plate 20 from the piezoelectric element 10** can be suppressed.

In the piezoelectric actuator 1 according to the embodiment, the recessed portion R is disposed at a position closer to the base end portion 22*d* of the lead portion 22 than the distal end portion 22*a* of the lead portion 22. Therefore, peeling of the electrode plate 20 from the piezoelectric element 10 can be further suppressed.

In the piezoelectric actuator 1 according to the embodiment, the lead portion 22 includes the recessed portions R in each of the side portions 22*b* and 22*c*. Therefore, peeling of the electrode plate 20 from the piezoelectric element 10 can be further suppressed.

In the piezoelectric actuator 1 according to the embodiment, the recessed portions R located in each of the side portions 22*b* and 22*c* of the lead portion 22 are located facing each other. Therefore, peeling of the electrode plate 20 from the piezoelectric element 10 can be further suppressed.

In the piezoelectric actuator 1 according to the embodiment, the recessed portions R located in the side portion 22*b* of the piezoelectric element 10 on the base end portion 10*e* side are deeper than the recessed portions R located in the side portion 22*c* of the piezoelectric element 10 on the distal end portion 10*f* side. Therefore, peeling of the electrode plate 20 from the piezoelectric element 10 can be further suppressed.

In the piezoelectric actuator 1 according to the embodiment, the recessed portion R is substantially V-shaped. Therefore, peeling of the electrode plate 20 from the piezoelectric element 10 can be further suppressed.

In the piezoelectric actuator 1 according to the embodiment, the bottom portion Ra of the recessed portion R has a round shape. Thus, the piezoelectric actuator 1 can have improved reliability.

In the piezoelectric actuator 1 according to the embodiment, the lead portion 22 includes the plurality of recessed portions R in the one side portion 22*c* (22*b*), and the one side portion 22*c* (22*b*) includes a site where the plating film M is not formed in a region (the first region 22*c*1) between adjacent ones of the recessed portions R. Therefore, peeling of the electrode plate 20 from the piezoelectric element 10 can be further suppressed.

In the piezoelectric actuator 1 according to the embodiment, the lead portion 22 includes the plurality of bent portions 22*e* and the hole portion 22*a*1 through which the lead terminal 30 is inserted, and the bent portions 22*e*2 and 22*e*3 located around the hole portion 22*a*1 each include the through hole 22*f* Thus, the piezoelectric actuator 1 can have improved reliability.

Although an embodiment of the present disclosure has been described above, the present disclosure is not limited to the embodiment described above, and various changes can be made without departing from the spirit of the present disclosure.

Additional effects and other aspects can be easily derived by a person skilled in the art. Thus, a wide variety of aspects of the present disclosure are not limited to the specific details and representative embodiments represented and described above. Accordingly, various changes are possible without departing from the spirit or scope of the general inventive concepts defined by the appended claims and their equivalents.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

The invention claimed is:

1. A piezoelectric actuator comprising:

a piezoelectric element layered in a pillar shape, the piezoelectric element including an internal electrode layer; and an electrode plate located on a side surface of the piezoelectric element and being electrically connected to the internal electrode layer of the piezoelectric element, the electrode plate comprising:

a body portion extending in a layering direction of the piezoelectric element; and a lead portion extending in a direction intersecting the layering direction and being electrically connected to a lead terminal, the lead portion comprising, in at least one side portion thereof, a recessed portion recessed in a width direction of the lead portion.

2. The piezoelectric actuator according to claim 1, wherein the recessed portion is disposed closer to a base end portion of the lead portion than to a distal end portion of the lead portion.

3. The piezoelectric actuator according to claim 1, wherein the lead portion comprises the recessed portion in a pair of side portions.

4. The piezoelectric actuator according to claim 3, wherein the recessed portions located in the pair of side portions of the lead portion are located facing each other.

5. The piezoelectric actuator according to claim 3, wherein the recessed portion comprises a recessed portion located in a side portion of the piezoelectric element on a base end portion side and a recessed portion located in a side portion of the piezoelectric element on a distal end portion side, and the recessed portion on the base end portion side is deeper than the recessed portion on the distal end portion side.

6. The piezoelectric actuator according to claim 1, wherein the recessed portion is substantially V-shaped.

7. The piezoelectric actuator according to claim 1, wherein a bottom portion of the recessed portion has a round shape.

8. The piezoelectric actuator according to claim 1, wherein the lead portion comprises, in the at least one side portion thereof, a plurality of recessed portions, and the at least one side portion comprises a site where a plating film is not formed in a region between adjacent recessed portions of the plurality of recessed portions.

9. The piezoelectric actuator according to claim 1, wherein the lead portion comprises a plurality of bent portions and a hole portion through which the lead terminal is inserted, and among the plurality of bent portions, a bent portion located around the hole portion comprises a through hole.

* * * * *